(12) United States Patent
Xie et al.

(10) Patent No.: US 12,124,646 B2
(45) Date of Patent: Oct. 22, 2024

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Yuanyuan Xie, Wuhan (CN); Zuzhao Xu, Wuhan (CN)

( * ) Notice: Subject to any disclaimer, the term of this patent is extended or adjusted under 35 U.S.C. 154(b) by 0 days.

(21) Appl. No.: 17/789,790

(22) PCT Filed: Jun. 27, 2022

(86) PCT No.: PCT/CN2022/101432
§ 371 (c)(1),
(2) Date: Nov. 30, 2023

(87) PCT Pub. No.: WO2023/226137
PCT Pub. Date: Nov. 30, 2023

(65) Prior Publication Data
US 2024/0176438 A1 May 30, 2024

(30) Foreign Application Priority Data
May 27, 2022 (CN) .......................... 202210594171.6

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G02F 1/13452* (2013.01); *H10K 59/131* (2023.02); *H10K 59/40* (2023.02)

(58) Field of Classification Search
CPC .............. G06F 3/0412; G02F 1/13338; G02F 1/13452; H10K 59/131; H10K 59/40
See application file for complete search history.

(56) References Cited

U.S. PATENT DOCUMENTS

2010/0225624 A1* 9/2010 Fu ........................... G09G 3/20
345/205
2016/0306212 A1 10/2016 Lim

FOREIGN PATENT DOCUMENTS

CN 1928676 A 3/2007
CN 105609028 A * 5/2016 ............. G01R 31/00
(Continued)

OTHER PUBLICATIONS

International Search Report in International application No. PCT/CN2022/101432, mailed on Feb. 13, 2023.
(Continued)

*Primary Examiner* — Jessica M Merlin

(57) ABSTRACT

An embodiment of the present disclosure provides a display panel, further including a plurality of signal lines; a plurality of fan-out wiring structures including a first group of wires and a second group of wires at both sides, the first group of wires including a first broken line segment and a second broken line segment in the same bending direction, and the second group of wires including a third broken line segment and a fourth broken line segment in the opposite bending direction; a plurality of chips respectively connected to one of the fan-out wiring structures. The impedances of the fan-out wires at opposite ends of the fan-out region may be matched with each other.

18 Claims, 3 Drawing Sheets

(51) Int. Cl.
  *G02F 1/1345* (2006.01)
  *H10K 59/131* (2023.01)
  *H10K 59/40* (2023.01)

(56) References Cited

FOREIGN PATENT DOCUMENTS

| | | | | |
|---|---|---|---|---|
| CN | 107121855 A | * | 9/2017 | ....... G02F 1/134309 |
| CN | 210323697 U | | 4/2020 | |

OTHER PUBLICATIONS

Written Opinion of the International Search Authority in International application No. PCT/CN2022/101432, mailed on Feb. 13, 2023.

\* cited by examiner

DISPLAY PANEL

FIELD OF INVENTION

The present disclosure relates to a field of display technology, in particular to a display panel.

BACKGROUND OF INVENTION

The application of display panels is becoming more and more popular, and it is commonly used in electronic devices such as mobile phones, televisions, computers, etc. The display panel generally includes a display area and a non-display area surrounding the display area. The non-display area is used for arranging wirings and chips, and the chips may provide control signals to signal lines of the display area.

An area between the chip and the display area may be referred to as a fan-out area in which fan-out wires are arranged for connecting the signal lines located in the display area and the chip located in the non-display area. The number of chips required varies with the size of the display panel. However, because the chip is limited by the signal line and the test board, the chip is usually not located at the middle position of the fan-out area, and consequently, the impedance difference between the two ends of the fan-out area is large, and the display panel is prone to the problem of bright and dark lines.

SUMMARY OF INVENTION

Technical Problem

Since the chip is limited by the signal lines and the test board, and the chip is usually not located at the middle position of the fan-out area, the impedance difference between the two ends of the fan-out area is large, and the display panel is prone to the problem of bright and dark lines.

Technical Solution

Embodiments of the present disclosure provide a display panel, so that the impedances at both ends of the fan-out area are matched with each other to reduce the probability of occurrence of bright and dark lines in the display panel.

Embodiments of the present disclosure provide a display panel including a display area and a non-display area surrounding the display area, the display panel further including:
  a plurality of signal lines located in the display area;
  a plurality of fan-out wiring structures disposed in the non-display area, wherein the plurality of fan-out wiring structures are connected to all signal lines, each of the fan-out wiring structures includes a plurality of fan-out wires arranged in sequence and spaced apart, the plurality of fan-out wires includes a first group of wires and a second group of wires on both sides of the fan-out wires, each of fan-out wires of the first group of wires includes a first broken line segment and a second broken line segment connected to each other, the first broken line segment and the second broken line segment have a same bending direction, each of fan-out wires of the second group of wires includes a third broken line segment and a fourth broken line segment connected to each other, and the third broken line segment and the fourth broken line segment have bending directions opposite to each other; and
  a plurality of chips disposed in the non-display area, wherein each of the chips is correspondingly connected to one of the fan-out wiring structures.

Advantageous Effects

In the display panel of the embodiment of the present disclosure, compared with the conventional fan-out wiring structure having only one broken line segment, in the case where the position of the chips and the height of the fan-out wiring structure are not changed, the first group of wires and the second group of wires on both sides of the fan-out wires are respectively set to have a structure with two broken line segments, and the broken line segments of the first group of wires are different from the broken line segments of the second group of wires, that is, the number of broken line segments are increased and the bending directions of the broken line segments are adjusted, even if the chip is not located at the middle position of the fan-out area, the lengths of the fan-out wires at the opposite ends of the fan-out area may be similar or equal, so that the impedances of the fan-out wires at the opposite ends of the fan-out area may be matched with each other, thereby reducing the probability of the problem of light and dark lines problems in the display panel.

DETAILED DESCRIPTION OF EMBODIMENTS

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In order to solve the problem that the conventional chip is not usually located at the middle position of the fan-out area due to the limitation of the signal line and the test board, the impedance difference between the two ends of the fan-out area is large, and the display panel is prone to the problem of bright and dark lines. Embodiments of the present disclosure provide a fan-out wiring structure and a display panel, which will be described below with reference to the accompanying drawings.

Figure 1:
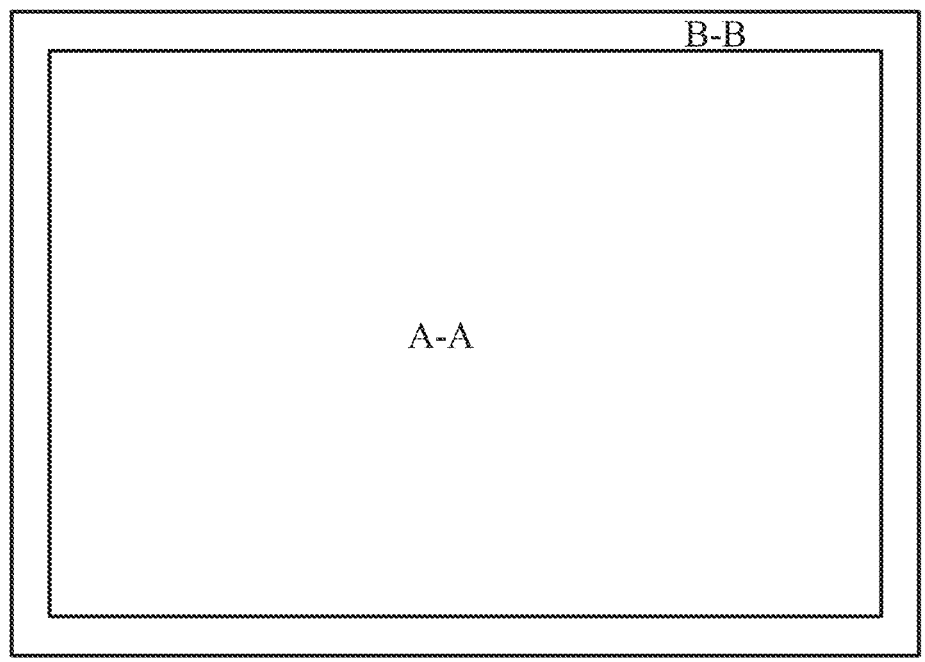
FIG. 1 is a first schematic structural view of a display panel according to an embodiment of the present disclosure.

Referring to FIG. 1, FIG. 1 is a first schematic structural view of a display panel according to an embodiment of the present disclosure. An embodiment of the present disclosure provides a display panel 1. For example, the display panel 1 may be an organic electroluminescence display (Organic Light-Emitting Diode, OLED) type display panel or a liquid crystal display (LCD) type display panel. The display principles of the two display panels are different. The LCD display panel emits light through a backlight, and then light is polarized by the liquid crystal to display different colors. However, the OLED does not require a backlight because the pixels of the OLED emit light themselves. The display panel 1 may be applied to an electronic device, for example, the electronic device may be a device having a display function, such as a television, a computer, a mobile phone, an in-vehicle display device, an augmented reality (AR) device, a virtual reality (VR) device, or the like.

Exemplarily, the display panel 1 may include a display area A-A and a non-display area B-B disposed around the display area A-A. The display area A-A is used to display an image. The non-display area B-B is used for arranging wires or chips. For example, the non-display area B-B may be divided into a fan-out area and a bonding area, the fan-out area is used to lead out the signal lines in the display area A-A to be connected to a chip, and the chip may send control signals to the signal lines. The fan-out area, also known as fanout, is named because the wires located in this area take the shape of the fan. The binding region is a region in which wires are bound together with a chip, such as a chip pin, so that a chip, a flexible circuit board, and the like may be disposed within the binding region. The fan-out area is also called fanout. The reason for its name is that the wires located in this area are in the shape of a fan. The bonding area is an area in which the wires are bonded to the chips, such as chip pins, and thus, the chips, flexible circuit boards, etc. may be arranged in the bonding area.

Figure 2:
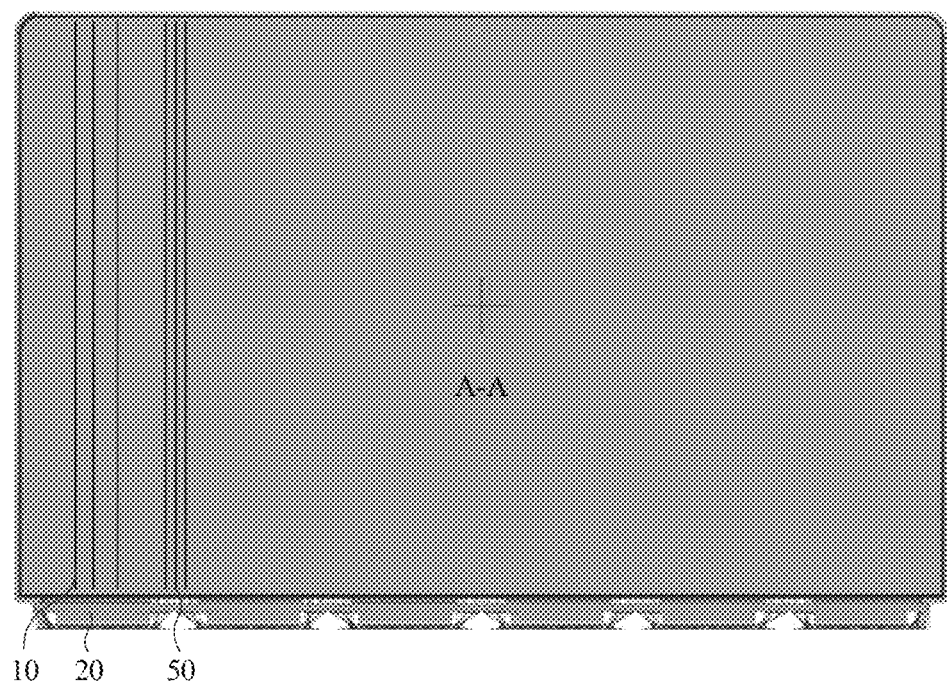
FIG. 2 is a second schematic structural view of a display panel according to an embodiment of the present disclosure.
Figure 3:
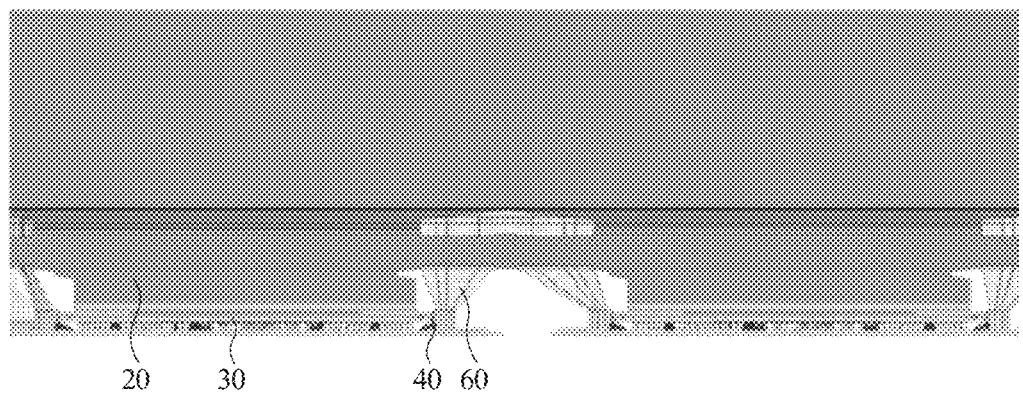
FIG. 3 is a schematic structural view of a part of the display panel shown in FIG. 2.

For example, referring to FIG. 1 and FIGS. 2 and 3, FIG. 2 is a second schematic structural view of a display panel according to an embodiment of the present disclosure, and FIG. 3 is a schematic structural diagram of a part of the display panel shown in FIG. 2. The display panel 1 includes a plurality of signal lines 10, a plurality of fan-out wiring structures 20, and a plurality of chips 30. The plurality of signal lines 10 are located within the display area A-A, and may be used to provide driving signals to pixels. The plurality of fan-out wiring structures 20 are disposed in the non-display area B-B, such as a fan-out area disposed in the non-display area B-B. The plurality of fan-out wiring structures 20 are connected to all the signal lines 10. The plurality of chips 30 are disposed in the non-display area B-B, and each chip 30 is correspondingly connected to one fan-out wiring structure 20. It is to be understood that the display panel 1 generally includes a driving circuit layer for driving the pixels of the pixel layer to emit light, and a pixel layer, and that the signal lines 10 may transmit the control signals from the chip 30 to the driving circuit layer so that the display panel 1 exhibits different display effects. It should be noted that the number of fan-out wiring structures 20 corresponds to the number of chips 30 one-to-one. The number of signal lines 10 and the number of fan-out wiring structures 20 are not in one-to-one correspondence, and the plurality of signal lines 10 and all of the fan-out wires of the plurality of fan-out wiring structures 20 are in one-to-one correspondence.

The plurality of chips 30 are arranged in one row and M columns in the non-display area B-B, where M is a positive integer, and the distance between every two adjacent chips 30 is equal. For example, for a terminal product, such as a television, with a medium size such as 14 inch, 6 chips 30a may be provided, and the 6 chips 30 are arranged at equal intervals in the non-display area B-B.

The display panel 1 may further include test boards 40 (Cell Test Pad, CTP). The test boards 40 are disposed at both ends of the chip 30, and the chips 30 needs to be arranged at equal intervals. Due to the limitation of the wires such as VDD, VSS, CTP, and the like, the chip 30 is generally not located at the middle position of the fan-out wiring structure, that is, the arrangement position of the fan-out wiring structure is asymmetric with respect to the chip 30, the wiring impedance difference between the two ends of the fan-out wiring structure is large, it is found during the testing, referring to FIGS. 1 to 3 and FIG. 4, FIG. 4 is a schematic structural diagram of the fan-out wiring structure in the prior art. In the normal fan-out wiring structure, the wiring impedances at both sides of the fan-out wires are: 463.7Ω at the left end and 365.78Ω at the right end. The difference in wiring impedance between the two sides is close to 100Ω, and the wiring impedances at the two sides obviously do not match each other. The impedance mismatch may cause the display panel to have a problem of bright and dark lines, thereby affecting the display effect.

In order to solve the above problems, the embodiment of the present disclosure improves the fan-out wiring structure 20, and the fan-out wiring structure 20 will be described below with reference to the accompanying drawings.

Figure 4:
FIG. 4 is a schematic structural view of a fan-out wiring structure in the prior art.
Figure 5:
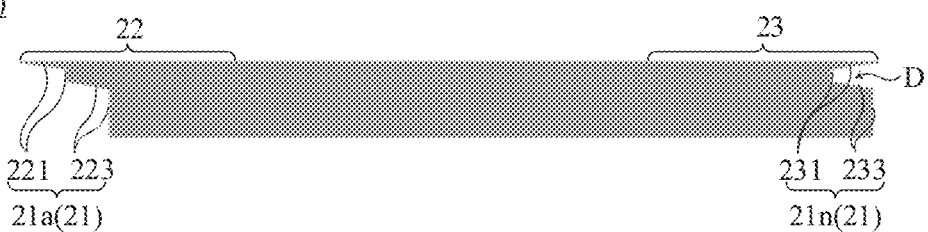
FIG. 5 is a first schematic structural view of a fan-out wiring structure according to an embodiment of the present disclosure.
Figure 6:
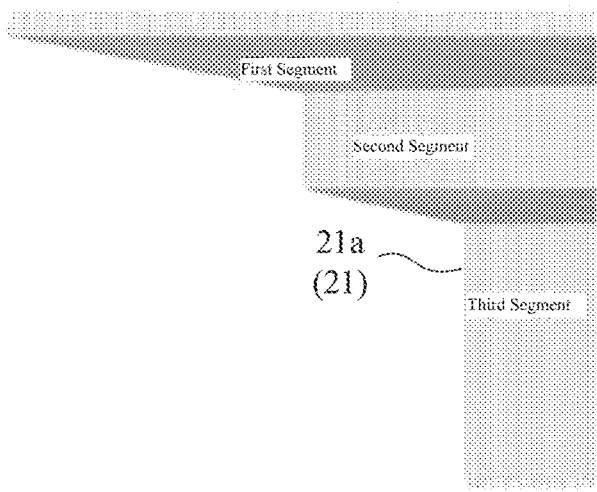
FIG. 6 is a partial structural view of a fan-out wiring structure shown in FIG. 5.
Figure 7:
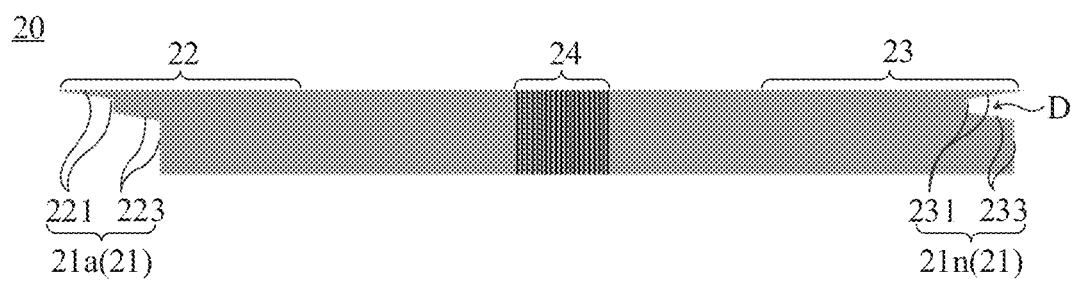
FIG. 7 is a second schematic structural view of a fan-out wiring structure according to an embodiment of the present disclosure.

Please refer to FIGS. 5 and 6 in conjunction with FIGS. 1 to 4. FIG. 5 is a first schematic structural diagram of a fan-out wiring structure according to an embodiment of the present disclosure, and FIG. 6 is a partial structural diagram of the fan-out wiring structure shown in FIG. 5. The fan-out wiring structure 20 may include a plurality of fan-out wires 21, the plurality of fan-out wires 21 are arranged in sequence and spaced apart, and the distances between all two adjacent fan-out wires 21 may be set to be equal to each other. The plurality of fan-out wires 21 include a first group of wires 22 and a second group of wires 23 on the two sides. It may be understood that the plurality of fan-out wires 21 constitute a fan-out wiring structure 20, and the fan-out wires 21 on the two sides or the two ends of the fan-out wiring structure 20 may be divided into the first group of wires 22 and the second group of wires 23. Each fan-out wire 21 of the first group of wires 22 may include a first broken line segment 221 and a second broken line segment 223 which are connected, and the first broken line segment 221 and the second broken line segment 223 have the same bending direction. Each fan-out wire 21 of the second group of wires 23 includes a third broken line segment 231 and a fourth broken line segment 233 which are connected, and the third broken line segment 231 and the fourth broken line segment 233 are bent in opposite directions. The bending direction may be understood as the direction of the included angle of the broken line segment. With a central axis as a reference, the included angles toward the same side of the central axis have the same bending direction, and the included angles toward the opposite sides of the central axis have the opposite bending direction.

In the display panel 1 according to the embodiment of the present disclosure, as compared with the conventional fan-out wiring structure having only one broken line segment, in the case where the position of the chips 30 and the height of the fan-out wiring structure 20 are not changed, the first group of wires 22 and the second group of wires 23 on both sides of the fan-out wires 21 are respectively set to have a structure with two broken line segments, and the broken line segments of the first group of wires 22 are different from the broken line segments of the second group of wires 23, that is, the number of broken line segments are increased and the bending directions of the broken line segments are adjusted, even if the chip 30 is not located at the middle position of the fan-out area, the lengths of the fan-out wires 21 at the opposite ends of the fan-out area may be similar or equal, so that the impedances of the fan-out wires 21 at the opposite ends of the fan-out area may be matched with each other, thereby reducing the probability of the problem of light and dark lines problems in the display panel 1.

In order to clarify the structural composition of the fan-out wiring structure 20, two fan-out wires 21 at the most edges of the left and right ends of the fan-out wiring structure 20 are taken as an example. The fan-out wiring structure 20 may have two fan-out wires 21 at left and right ends: a first fan-out wire 21a and a second fan-out wire 21n, that is, the first group of wires 22 may include the first fan-out wire 21a away from the second group of wires 23, and the second group of wires 23 may include the second fan-out wire 21n away from the first group of wires 22. A first broken line segment 221 of the first fan-out wire 21a and a third broken line segment 231 of the second fan-out wire 21n are symmetrical, and a second broken line segment 223 of the first fan-out wire 21a and a fourth broken line segment 233 of the second fan-out wire 21n are parallel. The first broken line segment 221 and the second broken line segment 223 of the first fan-out wire 21a have a first length, and the third broken line segment 231 and the fourth broken line segment 233 of the second fan-out wire 21n have a second length, the second length is equal to the first length, so that the impedances of the first fan-out wire 21a and the second fan-out wire 21n are matched with each other to prevent the occurrence of an uneven display effect of bright and dark lines. Of course, the second length may also be approximately equal to the first length, so that the impedances of the first fan-out wire 21a and the second fan-out wire 21n are similar to each other, and the probability of occurrence of bright and dark lines may also be reduced.

For example, there is a first distance between the portions of the first broken line segment 221 of the first fan-out wire 21a and the third broken line segment 231 of the second fan-out wire 21n that are parallel to each other, there is a second distance between the second broken line segment 223 of the first fan-out wire 21a and the fourth broken line segment 233 of the second fan-out wire 21n, and the second distance is equal to the first distance. A groove D is formed and surrounded by the third broken line segment 231 and the fourth broken line segment 233 of the second fan-out wire 21n. It may be appreciated that the formation of the groove D is achieved by the bending and cooperation of the third broken line segment 231 and the fourth broken line segment 233.

The remaining fan-out wires 21 in the first group of wires 22 and the remaining fan-out wires 21 in the second group of wires 23 may be described with reference to the first fan-out wire 21a and the second fan-out wire 21n, and the lengths of the wires may be understood to be symmetrically distributed. Details are not described herein.

It should be noted that, in FIG. 4, the fan-out wiring structure 20 has one broken line segment at both sides respectively, and the fan-out wires 21 on both sides have different lengths. On the basis of FIG. 4, as for the fan-out wiring structure 20 according to the embodiment of the present disclosure, the position of the chip 30 is not changed, the height of the fan-out wiring structure 20 is not changed, and the fan-out wiring 21 in the fan-out wiring structure 20 are changed from the structure consisting of one broken line segment to a structure consisting of two broken line segments, which is equivalent to shifting a part of the fan-out wires 21 to the left for a certain distance, so that the lengths of the fan-out wires 21 on both sides of the fan-out wiring structure 20 are approximately equal or equal, and the impedances of the fan-out wires 21 on both sides of the fan-out wiring structure 20 are balanced to reduce or avoid the occurrence of uneven display such as bright and dark lines. According to experimental determination, in the fan-out wiring structure 20 of the embodiment of the present application, the impedances of the first fan-out wire 21a and the second fan-out wire 21n are 574.44Ω and 574.35Ω respectively. The impedances of the fan-out wires 21 at both ends are matched with each other to avoid the occurrence of the problem of bright and dark lines.

The position of the chip 30 relative to the fan-out wiring structure 20 may be such that the distance between the chip 30 and the first fan-out wire 21a is larger than the distance between the chip 30 and the second fan-out wire 21n, that is, the chip 30 is closer to the second fan-out wire 21n. It may be understood that because the chip 30 is closer to the second fan-out wire 21n, the length of the second fan-out wire of the fan-out wiring structure 20 in the prior art is smaller than the length of the first fan-out wire 21a.

Of course, some of the fan-out wires 21 in the fan-out wiring structure 20 have shapes different from those of the first group of wires 22 and the second group of wires 23. For example, referring to FIG. 7 in conjunction with FIGS. 1 to 6, FIG. 7 is a second schematic structural view of a fan-out wiring structure according to an embodiment of the present disclosure. The fan-out wiring structure 20 may further include a third group of wires 24 located between the first group of wires 22 and the second group of wires 23, each fan-out wire 21 of the third group of wires 24 is linear, or each fan-out wire 21 of the third group of wires 24 is approximately linear.

It should be noted that for all the fan-out wires 21, the plurality of fan-out wires 21 are arranged in a double-layered arrangement. Since the number of the fan-out wires 21 is larger, the space for arranging the fan-out wires 21 in the same layer is insufficient, and the connection between the fan-out wires 21 and the signal lines 10 is not easy. In addition, when the display panel 1 is produced, at least two layers of metal are usually formed, and the two layers of metal may be used to form the fan-out wires 21 arranged in a double-layered arrangement, and the desired structure of the fan-out wires 21 is formed by etching.

Figure 8:
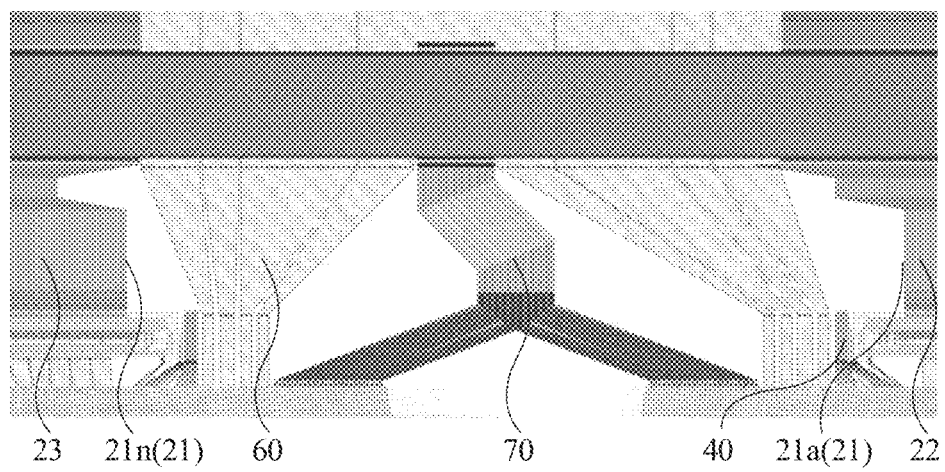
FIG. 8 is a schematic structural view of still another part of a display panel according to an embodiment of the present disclosure.

It should be noted that, referring to FIG. 8 and in conjunction with FIGS. 1 to 7, FIG. 8 is a schematic structural view of still another part of a display panel according to an embodiment of the present disclosure. The display panel 1 may further include a plurality of touch wires 50 and a plurality of fan-out touch structures 70. The plurality of touch wires 50 are each disposed in the display area A-A. The touch wires 50 are used to lead out signals of the touch electrodes in the display area A-A to the non-display area B-B, so as to receive signals of the touch electrodes or transmit control signals to the touch electrodes. The fan-out touch structures 70 are disposed in the non-display area B-B, such as a fan-out area of the non-display area B-B. The fan-out touch structure 70 are similar in function to the fan-out wiring structure 20, and the plurality of fan-out touch structures 70 are connected to all the touch wires 50, so as to connect the touch wires 50 and the touch chip in communication. For example, each fan-out touch structure 70 is disposed between two adjacent fan-out wiring structures 20. Each fan-out touch structure 70 may include a plurality of fan-out touch wires arranged in sequence. The fan-out touch structure 70 may include a first bent portion and a second bifurcated portion, the first bent portion is connected to the second bifurcated portion, and the second bifurcated portion is connected to the flexible circuit board, so as to lead the fan-out touch wires to the test board for testing.

Lead-out structures 60 are disposed at both ends of each fan-out touch structure 70. The lead-out structure 60 is disposed between the fan-out wiring structure 20 and the fan-out touch structure 70. The lead-out structure 60 is used to lead the VDD signal line and the VSS signal line of the display area A-A to the non-display area B-B. For example, the lead-out structure 60 may be fan-shaped.

It should be noted that the fan-out area of the non-display region B-B provided with the fan-out wiring structure 20, the lead-out structure 60, and the fan-out touch structure 70 may be bent along with the bending area to the back surface of the display panel 1, that is, the side facing away from the light emitting side, to narrow the bezel of the display panel 1.

In the display panel 1 according to the embodiment of the present disclosure, as compared with the conventional fan-out wiring structure having only one broken line segment, in the case where the position of the chip 30 and the height of the fan-out wiring structure 20 are not changed, the first group of wires 22 and the second group of wires 23 on both sides of the fan-out wires 21 are configured to have two broken line segments respectively, and the broken line segments of the first group of wires 22 are different from the broken line segments of the second group of wires 23, that is, by increasing the number of broken line segments and adjusting the bending direction of the broken line segments, even if the chip 30 is not at the middle position of the fan-out area, the lengths of the fan-out wires 21 at the opposite ends of the fan-out area may be made similar or equal, and the impedances of the fan-out wires 21 at the opposite ends of the fan-out area may be matched with each other, thereby reducing the probability of occurrence of bright and dark lines in the display panel 1.

In the above-described embodiments, the description of each embodiment has its own emphasis. For parts that are not described in detail in a certain embodiment, reference may be made to the relevant descriptions of other embodiments.

In the description of this disclosure, the terms "first" and "second" are only used for description purposes, and may not be understood as indicating or implying relative importance or implying the number of indicated technical features. Thus, features defined by "first", "second" may expressly or implicitly include one or more features.

The display panel provided in the embodiments of the present disclosure is described in detail above. The principles and implementation of the present disclosure are described herein by applying specific examples. The description of the above embodiments is only used to help understand the method and core idea of the present disclosure. Meanwhile, for those skilled in the art, according to the idea of the present disclosure, some changes may be made to specific embodiments and application scope. In conclusion, the contents of the present specification shall not be construed as limiting the present disclosure.

What is claimed is:

1. A display panel comprising a display area and a non-display area surrounding the display area, the display panel further comprising:
   a plurality of signal lines located in the display area;
   a plurality of fan-out wiring structures disposed in the non-display area, wherein the plurality of fan-out wiring structures are connected to all signal lines, each of the fan-out wiring structures comprises a plurality of fan-out wires arranged in sequence and spaced apart, the plurality of fan-out wires comprises a first group of wires and a second group of wires on both sides of the fan-out wires, each of fan-out wires of the first group of wires comprises a first broken line segment and a second broken line segment connected to each other, the first broken line segment and the second broken line segment have a same bending direction, each of fan-out wires of the second group of wires comprises a third broken line segment and a fourth broken line segment connected to each other, and the third broken line segment and the fourth broken line segment have bending directions opposite to each other; and
   a plurality of chips disposed in the non-display area, wherein each of the chips is correspondingly connected to one of the fan-out wiring structures,
   wherein the first group of wires comprises a first fan-out wire away from the second group of wires, the second group of wires comprises a second fan-out wire away from the first group of wires, a first broken line segment of the first fan-out wire is symmetrical to a third broken line segment of the second fan-out wire, and a second broken line segment of the first fan-out wire is parallel to a fourth broken line segment of the second fan-out wire, and
   wherein a distance between the chip and the first fan-out wire is greater than a distance between the chip and the second fan-out wire.

2. The display panel according to claim 1, wherein the first broken line segment and the second broken line segment have a first length, the third broken line segment and the fourth broken line segment have a second length, and the second length is equal to the first length.

3. The display panel according to claim 1, wherein there is a first distance between parallel portions of the first broken line segment of the first fan-out wire and the third broken line segment of the second fan-out wire, there is a second distance between the second broken line segment of the first fan-out wire and the fourth broken line segment of the second fan-out wire, and the second distance is equal to the first distance.

4. The display panel according to claim 1, wherein a groove is formed and surrounded by the third broken line segment and the fourth broken line segment of the second fan-out wire.

5. The display panel according to claim 4, wherein the fan-out wiring structure further comprises:
   a third group of wires disposed between the first group of wires and the second group of wires, each of fan-out wires of the third group of wires is linear.

6. The display panel according to claim 5, wherein the plurality of fan-out wires are arranged in a double-layered arrangement.

7. The display panel according to claim 1, wherein the plurality of chips are arranged in one row and M columns in the non-display area, M is a positive integer, and a distance between every two adjacent chips is equal.

8. The display panel according to claim 1, further comprising:
    a plurality of touch wires disposed in the display area; and
    a plurality of fan-out touch structures disposed in the non-display area, and each of the fan-out touch structures disposed between two adjacent fan-out wiring structures, the plurality of fan-out touch structures connected to all the touch wires.

9. The display panel according to claim 8, wherein each of the fan-out touch structures comprises:
    a first bent portion; and
    a second bifurcated portion having one end connected to the first bent portion and another end connected to a flexible circuit board.

10. The display panel according to claim 9, further comprising:
    lead-out structures disposed at both ends of each of the fan-out touch structures to lead a VDD signal line and a VSS signal line in the display area to the non-display area.

11. The display panel according to claim 10, wherein the lead-out structures are fan-shaped.

12. The display panel according to claim 1, further comprising:
    a plurality of test boards, each of the test boards being disposed at both ends of one of the chips.

13. The display panel according to claim 1, wherein the non-display area comprises a fan-out area and a bonding area, the plurality of fan-out wires are disposed in the fan-out area, and the plurality of chips are disposed in the bonding area.

14. The display panel according to claim 1, wherein lengths of the fan-out wires of the first group of wires and the second group of wires are symmetrical.

15. The display panel according to claim 14, wherein shapes of the fan-out wires of the first group of wires and the second group of wires are asymmetrical.

16. The display panel according to claim 14, wherein a number of chips is six.

17. The display panel according to claim 1, wherein a number of the fan-out wiring structures is six.

18. The display panel according to claim 1, wherein the display panel is an OLED panel or an LCD panel.

* * * * *